US012563905B2

(12) United States Patent (10) Patent No.: US 12,563,905 B2
Xu et al. (45) Date of Patent: Feb. 24, 2026

(54) DISPLAY SUBSTRATE AND MANUFACTURING METHOD THEREFOR, AND DISPLAY APPARATUS

(71) Applicants:BEIJING BOE DISPLAY TECHNOLOGY CO., LTD., Beijing (CN); BOE TECHNOLOGY GROUP CO., LTD., Beijing (CN)

(72) Inventors: Chuanxiang Xu, Beijing (CN); Shi Shu, Beijing (CN); Qi Yao, Beijing (CN); Haitao Huang, Beijing (CN); Yang Yue, Beijing (CN); Xiang Li, Beijing (CN); Renquan Gu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 770 days.

(21) Appl. No.: 17/920,883

(22) PCT Filed: Sep. 3, 2021

(86) PCT No.: PCT/CN2021/116543
§ 371 (c)(1),
(2) Date: Oct. 24, 2022

(87) PCT Pub. No.: WO2022/088992
PCT Pub. Date: May 5, 2022

(65) Prior Publication Data
US 2023/0172036 A1 Jun. 1, 2023

(30) Foreign Application Priority Data

Oct. 30, 2020 (CN) .......................... 202011197996.1

(51) Int. Cl.
H10K 59/122 (2023.01)
H10K 59/38 (2023.01)
(Continued)

(52) U.S. Cl.
CPC ........... H10K 59/122 (2023.02); H10K 59/38 (2023.02); H10K 59/8722 (2023.02);
(Continued)

(58) Field of Classification Search
None
See application file for complete search history.

(56) References Cited

U.S. PATENT DOCUMENTS

2008/0087921 A1* 4/2008 Yu ........................ H10F 39/8063
257/213
2016/0087018 A1* 3/2016 Shim ...................... H10K 59/38
257/40

(Continued)

FOREIGN PATENT DOCUMENTS

CN 109493746 A 3/2019
CN 111261680 A 6/2020
(Continued)

OTHER PUBLICATIONS

First Office Action for Chinese Patent Application No. 202011197996.1 issued by the Chinese Patent Office on Feb. 24, 2023.

*Primary Examiner* — Benjamin P Sandvik
(74) *Attorney, Agent, or Firm* — XSENSUS LLP

(57) ABSTRACT
A display substrate has a display region that includes a functional device arrangement region. The functional device arrangement region includes a plurality of light-emitting regions and a light-transmissive region located at peripheries of the light-emitting regions. The display substrate includes a substrate, a plurality of first lenses disposed on the substrate, an encapsulation layer disposed on a side of the
(Continued)

plurality of first lenses away from the substrate, and a plurality of second lenses disposed on a side of the encapsulation layer away from the substrate. The first lenses and the second lenses are located in the light-transmissive region. In a direction perpendicular to the substrate, a second lens in the second lenses is arranged opposite to a first lens in the first lenses; a focal point of the first lens substantially coincides with a focal point of the second lens that is arranged opposite to the first lens.

16 Claims, 15 Drawing Sheets

(51) Int. Cl.
|  |  |
|---|---|
| *H10K 59/65* | (2023.01) |
| *H10K 59/80* | (2023.01) |
| *H10K 102/00* | (2023.01) |

(52) U.S. Cl.
CPC ........... *H10K 59/879* (2023.02); *H10K 59/65* (2023.02); *H10K 59/873* (2023.02); *H10K 59/8792* (2023.02); *H10K 2102/302* (2023.02)

(56) References Cited

U.S. PATENT DOCUMENTS

| | | | |
|---|---|---|---|
| 2019/0251318 A1* | 8/2019 | Jung | ................... G06V 40/1306 |
| 2020/0212362 A1 | 7/2020 | Leng et al. | |
| 2021/0296409 A1* | 9/2021 | Yamazaki | .............. H05B 33/02 |
| 2021/0408496 A1* | 12/2021 | Choi | .................... H10K 59/875 |
| 2025/0048899 A1* | 2/2025 | Liu | ......................... H10K 59/90 |

FOREIGN PATENT DOCUMENTS

| | | |
|---|---|---|
| CN | 111725429 A | 9/2020 |
| CN | 111726502 A | 9/2020 |
| JP | 2010-20237 A | 1/2010 |

* cited by examiner

B (100)

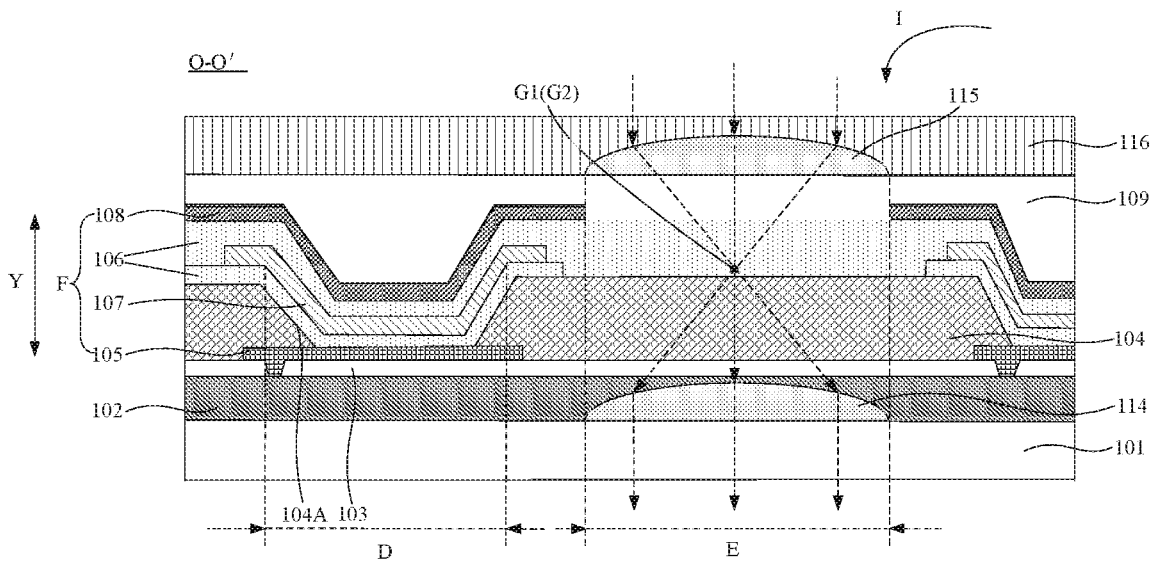

FIG. 7

```
┌─────────────────────────────────┐
│  Form a plurality of first lenses on a  │ ─────── S1
│             substrate                   │
└─────────────────────────────────┘
                 │
                 ▼
┌─────────────────────────────────┐
│  Form an encapsulation layer on a side  │
│  of the plurality of first lenses away from │ ─────── S2
│           the substrate                 │
└─────────────────────────────────┘
                 │
                 ▼
┌─────────────────────────────────┐
│  Form a plurality of second lenses on a │
│  side of the encapsulation layer away from │ ─────── S3
│           the substrate                 │
└─────────────────────────────────┘
```

FIG. 8A

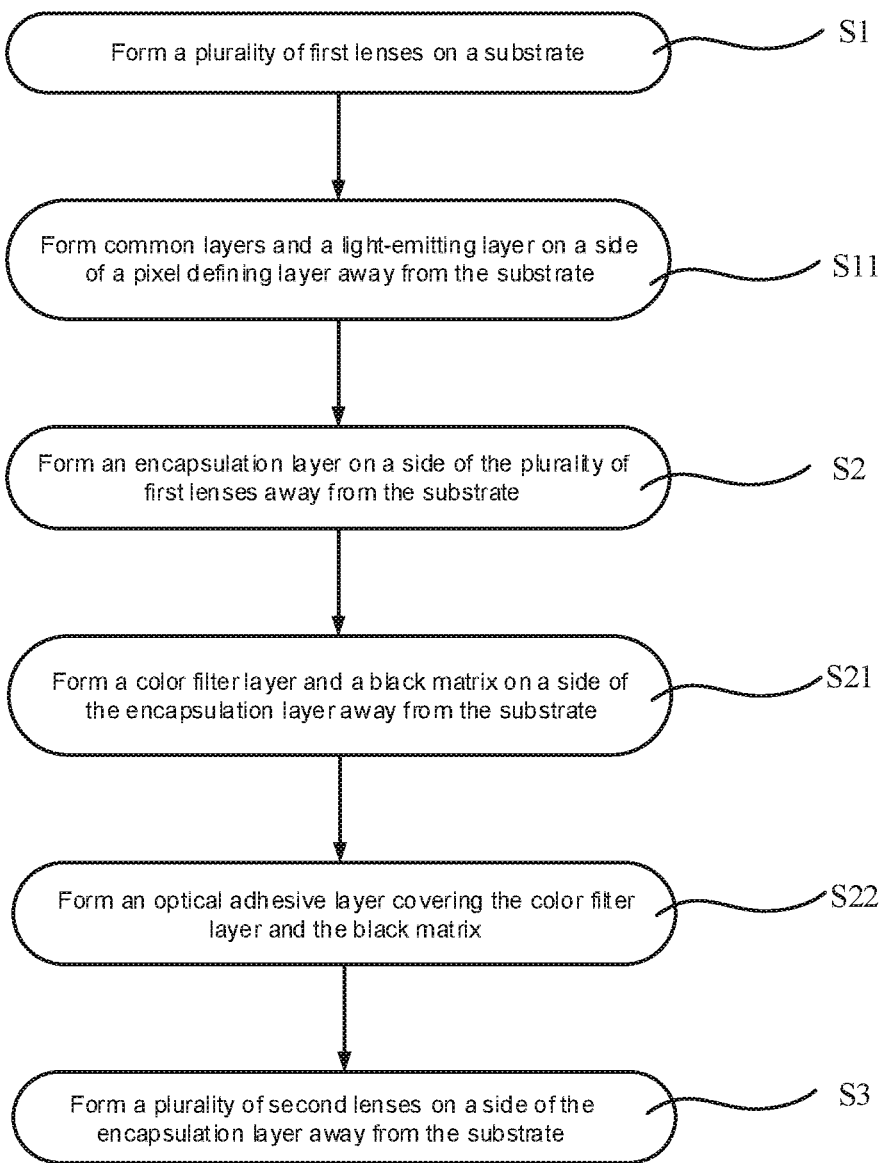

Form a plurality of first lenses on a substrate — S1

Form common layers and a light-emitting layer on a side of a pixel defining layer away from the substrate — S11

Form an encapsulation layer on a side of the plurality of first lenses away from the substrate — S2

Form a color filter layer and a black matrix on a side of the encapsulation layer away from the substrate — S21

Form an optical adhesive layer covering the color filter layer and the black matrix — S22

Form a plurality of second lenses on a side of the encapsulation layer away from the substrate — S3

FIG. 8B

DISPLAY SUBSTRATE AND MANUFACTURING METHOD THEREFOR, AND DISPLAY APPARATUS

CROSS-REFERENCE TO RELATED APPLICATIONS

This application is a national phase entry under 35 USC 371 of International Patent Application No. PCT/CN2021/116543, filed on Sep. 3, 2021, which claims priority to Chinese Patent Application No. 202011197996.1, filed on Oct. 30, 2020, which are incorporated herein by reference in their entirety.

TECHNICAL FIELD

The present disclosure relates to the field of display technologies, and in particular, to a display substrate and a manufacturing method therefor, and a display apparatus.

BACKGROUND

Organic light-emitting diode (OLED) display apparatuses have become one of mainstreams in the display field due to their characteristics such as high color gamut, thinness and lightness, and flexibility.

With the development of the display technologies, various functional sensors (such as a device having a face identification function (face identity (ID)), a device having an under-screen fingerprint identification function, or an under-screen camera (which is also referred to as under-display camera (UDC) or under-panel camera (UPC))) may be provided under a display screen (on a non-display side of the display screen).

At present, the display screen mostly adopts a U-shaped notch screen, a V-shaped (widow's peak) notch screen, a water-drop notch screen, a punch-hole screen, etc., so that an area of a display region of the display screen occupied by a functional device (e.g., a front camera) of a display apparatus is reduced. As a result, a screen-to-body ratio of the display screen is improved. For example, the display apparatus adopts the under-screen camera design (that is, cameras are provided under the display screen), so that the front camera does not occupy the area of the display region of the display screen at all. Thus, the screen-to-body ratio of the display screen reaches or approaches 100% to achieve a full screen.

SUMMARY

In an aspect, a display substrate is provided, the display substrate has a display region. The display region includes a functional device arrangement region. The functional device arrangement region includes a plurality of light-emitting regions, and a light-transmissive region located at peripheries of the plurality of light-emitting regions.

The display substrate includes a substrate, a plurality of first lenses disposed on the substrate, an encapsulation layer disposed on a side of the plurality of first lenses away from the substrate, and a plurality of second lenses disposed on a side of the encapsulation layer away from the substrate. The plurality of first lenses are located in the light-transmissive region. The plurality of second lenses are located in the light-transmissive region; in a direction perpendicular to the substrate, a second lens in the plurality of second lenses is arranged opposite to a first lens in the plurality of first lenses, and a focal point of the first lens substantially coincides with a focal point of the second lens that is arranged opposite to the first lens.

In some embodiments, the display substrate further includes a color filter layer disposed on the side of the encapsulation layer away from the substrate, and a black matrix disposed on the side of the encapsulation layer away from the substrate.

The color filter layer includes a plurality of photoresist units, and in the functional device arrangement region, an orthographic projection of a photoresist unit in the plurality of photoresist units on the substrate at least partially overlaps with a light-emitting region in the plurality of light-emitting regions. The black matrix is located between every two adjacent photoresist units; a portion of the black matrix located in the functional device arrangement region has a plurality of through holes therein, orthographic projections of the plurality of through holes on the substrate are located within the light-transmissive region, and orthographic projections of the first lens and the second lens that are arranged opposite to each other on the substrate both at least partially overlap with an orthographic projection of a through hole in the plurality of through holes on the substrate.

In some embodiments, the display substrate further includes an optical adhesive layer covering both the color filter layer and the black matrix. The plurality of second lenses are disposed on a side of the optical adhesive layer away from the substrate.

In some embodiments, the second lens is disposed in the through holes in the black matrix.

In some embodiments, a surface of the second lens proximate to the substrate is substantially flush with a surface of the black matrix proximate to the substrate. With respect to the substrate, a highest point on a surface of the second lens away from the substrate is higher than a surface of the black matrix away from the substrate, or the highest point on the surface of the second lens away from the substrate is substantially flush with the surface of the black matrix away from the substrate.

In some embodiments, the display substrate further includes a polarizer disposed on the side of the encapsulation layer away from the substrate. The plurality of second lenses are disposed between the encapsulation layer and the polarizer, and the plurality of second lenses are in direct contact with the encapsulation layer.

In some embodiments, the display substrate further includes a pixel defining layer disposed between the substrate and the encapsulation layer. The pixel defining layer has a plurality of openings therein, and in the functional device arrangement region, an orthographic projection of an opening in the plurality of openings on the substrate at least partially overlaps with a light-emitting region in the plurality of light-emitting regions.

In some embodiments, the plurality of first lenses are disposed on a surface of the pixel defining layer away from the substrate, the plurality of first lenses and the pixel defining layer constitute a one-piece structure.

In some embodiments, the plurality of first lenses are disposed on a side of the pixel defining layer away from the substrate, and the plurality of first lenses are in direct contact with the pixel defining layer.

In some embodiments, the display substrate further includes a pixel driving circuit layer disposed between the substrate and the pixel defining layer. The plurality of first lenses are disposed between the substrate and the pixel driving circuit layer.

In some embodiments, a surface of the first lens away from the substrate is a curved surface, and the curved surface of the first lens is convex in a direction away from the substrate; and/or, a surface of the second lens away from the substrate is a curved surface, and the curved surface of the second lens is convex in the direction away from the substrate.

In some embodiments, the first lens is a convex lens; and/or the second lens is another convex lens.

In some embodiments, in the direction perpendicular to the substrate, a maximum thickness of the first lens is in a range of 2 μm to 15 μm, inclusive; and/or, in the direction perpendicular to the substrate, a maximum thickness of the second lens is in a range of 2 μm to 15 μm, inclusive.

In some embodiments, the display substrate further includes a cathode layer disposed between the substrate and the encapsulation layer. The cathode layer covers the display region of the display substrate; or orthographic projections of portions of the cathode layer located in the functional device arrangement region on the substrate do not overlap with the light-transmissive region.

In some embodiments, the display substrate further includes a plurality of film layers disposed between the plurality of first lenses and the plurality of second lenses. A refractive index of each film in the plurality of film layers is less than a refractive index of the first lens, and less than a refractive index of the second lens.

In some embodiments, in the direction perpendicular to the substrate, a distance between the first lens and the second lens that are arranged opposite to each other is in a range of 6 μm to 20 μm, inclusive.

In another aspect, a display apparatus is provided. The display apparatus includes the display substrate as described in any of the above embodiments, and at least one camera located on a non-display side of the display substrate.

In yet another aspect, a manufacturing method for a display substrate is provided. The display substrate has a display region, the display region includes a functional device arrangement region; the functional device arrangement region includes a plurality of light-emitting regions that are non-light-transmissive, and a light-transmissive region located at peripheries of the plurality of light-emitting regions. The manufacturing method includes:

forming a plurality of first lenses on a substrate, the plurality of first lenses being located in the light-transmissive region;

forming an encapsulation layer on a side of the plurality of the first lenses away from the substrate; and forming a plurality of second lenses on a side of the encapsulation layer away from the substrate, the plurality of second lenses being located in the light-transmissive region; in a direction perpendicular to the substrate, a second lens in the plurality of second lenses being arranged opposite to a first lens in the plurality of first lenses, and a focal point of the first lens substantially coinciding with a focal point of the second lens that is arranged opposite to the first lens.

In some embodiments, forming the plurality of first lenses on the substrate, includes:

forming a pixel defining layer and the plurality of first lenses simultaneously. The plurality of first lenses are located on a surface of the pixel defining layer away from the substrate, the plurality of first lenses and the pixel defining layer form a one-piece structure. The pixel defining layer has a plurality of openings therein, and in the functional device arrangement region, an orthographic projection of an opening in the plurality of openings on the substrate at least partially overlaps with a light-emitting region in the plurality of light-emitting regions.

Alternatively, forming the plurality of first lenses on the substrate, includes:

forming a pixel defining layer on the substrate. The pixel defining layer has a plurality of openings therein, and in the functional device arrangement region, an orthographic projection of an opening in the plurality of openings on the substrate at least partially overlaps with a light-emitting region in the plurality of light-emitting regions; and forming the plurality of first lenses on a side of the pixel defining layer away from the substrate, the plurality of first lenses being in direct contact with the pixel defining layer.

Alternatively, forming the plurality of first lenses on the substrate, includes:

forming the plurality of first lenses on the substrate, the plurality of first lenses being in direct contact with the substrate.

In some embodiments, forming the plurality of second lenses on the side of the encapsulation layer away from the substrate, includes:

forming a color filter layer and a black matrix on the side of the encapsulation layer away from the substrate; the color filter layer including a plurality of photoresist units, and in the functional device arrangement region, an orthographic projection of a photoresist unit in the plurality of photoresist units on the substrate at least partially overlapping with a light-emitting region in the plurality of light-emitting regions, the black matrix being located between every two adjacent photoresist units, a portion of the black matrix located in the functional device arrangement region having a plurality of through holes therein, and orthographic projections of the plurality of through holes on the substrate being located within the light-transmissive region; and forming the plurality of second lenses in the through holes in the black matrix, respectively.

Alternatively, forming the plurality of second lenses on the side of the encapsulation layer away from the substrate, includes:

forming a color filter layer and a black matrix on the side of the encapsulation layer away from the substrate, the color filter layer including a plurality of photoresist units, and in the functional device arrangement region, an orthographic projection of a photoresist unit in the plurality of photoresist units on the substrate at least partially overlapping with a light-emitting region in the plurality of light-emitting regions, the black matrix being located between every two adjacent photoresist units, a portion of the black matrix located in the functional device arrangement region having a plurality of through holes therein, and orthographic projections of the plurality of through holes on the substrate being located within the light-transmissive region; forming an optical adhesive layer covering both the color filter layer and the black matrix; and forming the plurality of second lenses on a side of the optical adhesive layer away from the substrate.

Alternatively, forming the plurality of second lenses on the side of the encapsulation layer away from the substrate, includes:

forming the plurality of second lenses on the side of the encapsulation layer away from the substrate, the plurality of second lenses being in direct contact with the encapsulation layer; and forming a polarizer on a side of the plurality of second lenses away from the substrate.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these accompanying drawings. In addition, the accompanying drawings to be described below may be regarded as schematic diagrams, and are not limitations on actual sizes of products, actual processes of methods and actual timings of signals involved in the embodiments of the present disclosure.

FIGS. 4 to 7 are sectional views of some other display substrates, in accordance with some embodiments;

FIG. 8A is a flowchart of a manufacturing method for a display substrate, in accordance with some embodiments;

FIG. 8B is a flowchart of a manufacturing method for another display substrate, in accordance with some embodiments;

DETAILED DESCRIPTION

Figure 1:
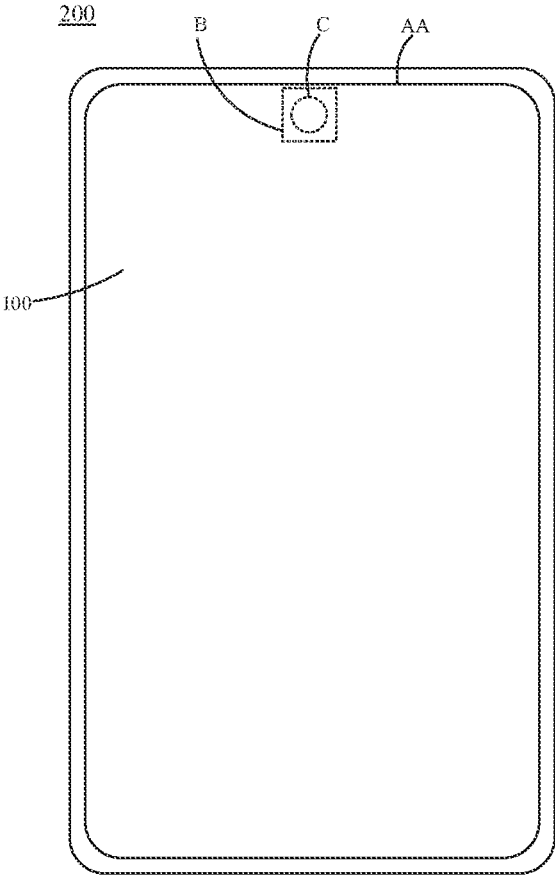
FIG. 1 is a top view of a display apparatus, in accordance with some embodiments.

Technical solutions in some embodiments of the present disclosure will be described clearly and completely below with reference to accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "an example", "a specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or examples(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying relative importance or implicitly indicating the number of indicated technical features. Thus, a feature defined with "first" or "second" may explicitly or implicitly include one or more features. In the description of the embodiments of the present disclosure, the terms "a plurality of", "the plurality of" and "multiple" each mean two or more unless otherwise specified.

In the description of some embodiments, the terms "connected" and "electrically connected" and derivatives thereof may be used. For example, the term "electrically connected" may be used in the description of some embodiments to indicate that two or more components are in direct physical or electrical contact with each other. The embodiments disclosed herein are not necessarily limited to the content herein.

The phrase "A and/or B" includes the following three combinations: only A, only B, and a combination of A and B.

The phrase "configured to" used herein means an open and inclusive expression, which does not exclude devices that are configured to perform additional tasks or steps.

In addition, the phrase "based on" used is meant to be open and inclusive, since a process, step, calculation or other action that is "based on" one or more of the stated conditions or values may, in practice, be based on additional conditions or values exceeding those stated.

As used herein, the term such as "substantially" includes a stated value and an average value within an acceptable range of deviation of a particular value. The acceptable range of deviation is determined by a person of ordinary skill in the art in view of the measurement in question and errors associated with the measurement of a particular quantity (i.e., the limitations of the measurement system).

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of regions in an apparatus, and are not intended to limit the scope of the exemplary embodiments.

Some embodiments of the present disclosure provide a display apparatus. The display apparatus may be an electroluminescent display apparatus.

In the case where the display apparatus is the electroluminescent display apparatus, the electroluminescent display apparatus may be an organic light-emitting diode (OLED) display apparatus or a quantum dot light-emitting diode (QLED) display apparatus.

As shown in FIG. 1, the display apparatus 200 is the organic light-emitting diode display apparatus, which includes a display substrate 100 and functional device(s) C located on a non-display side of the display substrate 100 (i.e., a side opposite to a display side of the display substrate 100). The non-display side is located under the display substrate 100 in FIG. 1. The functional device(s) include at least one of a face identification module, an under-screen fingerprint identification module, an iris identification module, an infrared proximity sensor, a camera, etc.

The display apparatus 200 may be any apparatus that displays an image whether in motion (e.g., videos) or stationary (e.g., static images), and whether literal or graphical. More specifically, it is anticipated that the above embodiments may be implemented in or associated with a variety of electronic apparatuses. The variety of electronic apparatuses are, but not limited to, mobile phones, wireless apparatuses, personal data assistants (PDAs), hand-held or portable computers, global positioning system (GPS) receivers/navigators, cameras, MPEG-4 Part 14 (MP4) video players, video cameras, game consoles, watches, clocks, calculators, television monitors, flat panel displays, computer monitors, vehicle displays (e.g., odometer displays), navigators, cockpit controllers and/or displays, camera view displays (e.g., rear-view camera displays in vehicles), electronic photos, electronic billboards or signs, projectors, architectural structures, packagings, and aesthetic structures (e.g., displays for displaying an image of a piece of jewelry).

In the related art, a large number of pixel circuits are provided in the display substrate. For a display apparatus in which functional device(s) are provided on a non-display side of a display substrate, multiple pixel circuits exist in a region (which is referred to as a functional device arrangement region hereinafter) corresponding to the functional device(s) in a display region of the display substrate. Since the pixel circuits include multiple film layer structures made of metal materials, and these film layer structures have a blocking effect on light, an area of a non-light-transmissive region in the functional device arrangement region is large, and an area of a light-transmissive region in the functional device arrangement region is small. Moreover, light-emitting devices themselves are also non-light-transmissive, which cause a proportion of the area of the light-transmissive region to an area of the functional device arrangement region is small. As a result, light transmittance of the functional device arrangement region of the display substrate is small.

Since the light transmittance of the functional device arrangement region of the display substrate is small, light received by the functional device located on the non-display side of the display substrate is less. As a result, the functional device cannot obtain an accurate sensing signal. For example, a quality of an image acquired by an under-screen camera is low or even the image cannot be acquired.

In order to solve the above problems, some embodiments of the present disclosure provide a display substrate. As shown in FIG. 1, the display substrate 100 has a display region AA. The display region AA includes a functional device arrangement region B. It will be noted that, the functional device arrangement region B refers to a region of the display substrate 100 for arranging the functional device(s) C of the display apparatus 200.

Figure 2:
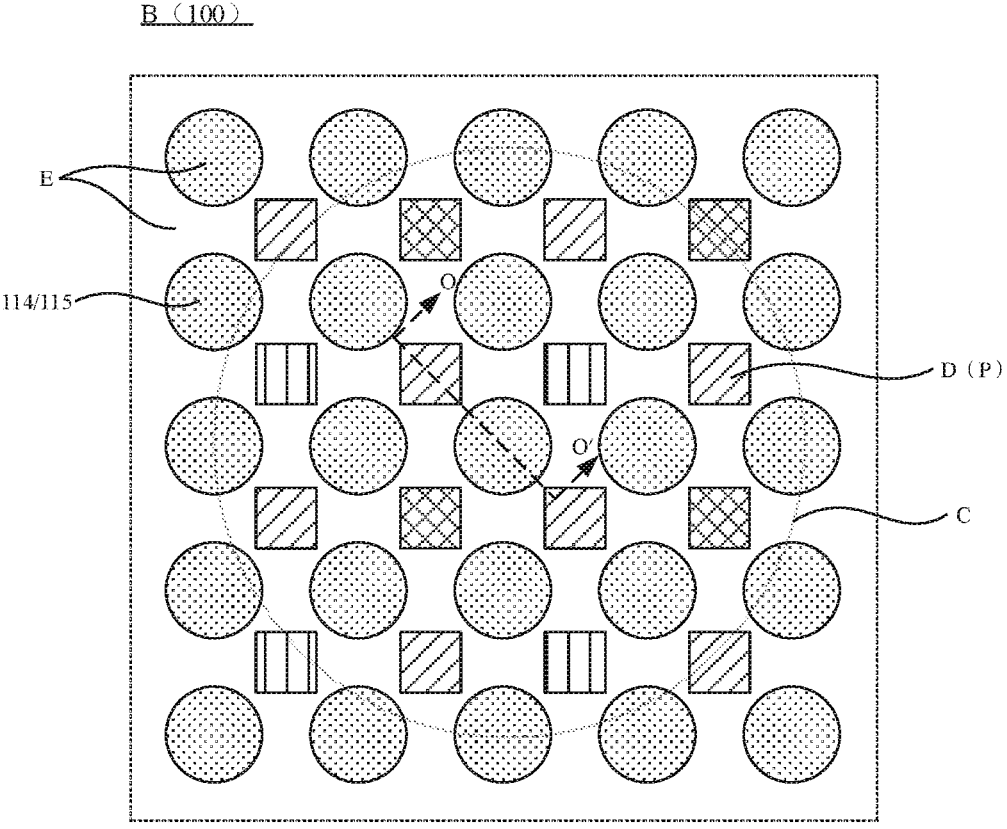
FIG. 2 is a partial enlargement view of the region shown in the dotted frame B in FIG. 1.
Figure 3:
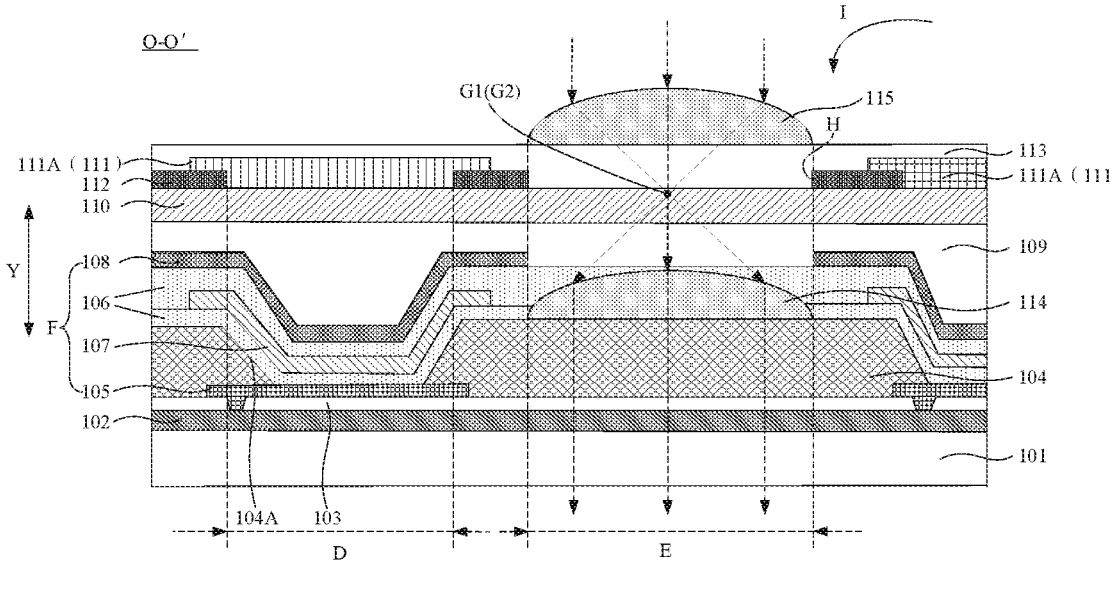
FIG. 3 is a sectional view of a display substrate taken along the line O-O' in FIG. 2, in accordance with some embodiments.

As shown in FIGS. 2 and 3, the functional device arrangement region B includes a plurality of light-emitting regions D and a light-transmissive region E located at peripheries of the plurality of light-emitting regions D. The light-emitting regions D are non-light-transmissive.

It will be noted that, the light-emitting regions D are sub-pixel regions P, a sub-pixel region P is provided with a light-emitting device F therein, and each light-emitting device F includes an anode layer 105, a light-emitting layer 107 and a portion of a cathode layer 108 in the sub-pixel region P. The anode layer 105 of the light-emitting device F is electrically connected to a pixel driving circuit layer 102 through via hole(s) in a planarization layer 103. The light-emitting layer 107 and the cathode layer 108 are sequentially disposed on a side of the anode layer 105 away from a substrate 101.

In some embodiments, the light-emitting device F further includes common layer(s) 106 located on a side of the light-emitting layer 107 proximate to the anode layer 105 and other common layer(s) 106 located on a side of the light-emitting layer 107 proximate to the cathode layer 108. The common layer(s) 106 located between the light-emitting layer 107 and the anode layer 105 may include at least one of a hole transport layer (HTL) and a hole injection layer (HIL). The common layer(s) 106 located between the light-emitting layer 107 and the cathode layer 108 may include at least one of an electron transport layer (ETL) and an electron injection layer (EIL).

The pixel driving circuit layer 102 is used to supply a voltage to the anode layer 105 of the light-emitting device F, and supply another voltage to the cathode layer 108 of the light-emitting device F, so that a voltage difference is formed between the anode layer 105 and the cathode layer 108. Thus, the light-emitting layer 107 of the light-emitting device F is driven to emit light, so that the display apparatus 200 displays images.

As shown in FIGS. 2 and 3, the display substrate 100 includes the substrate 101 and a plurality of first lenses 114 disposed on the substrate 101. The plurality of first lenses 114 are located in the light-transmissive region E.

It will be noted that, one or more first lenses 114 may be disposed in a part of the light-transmissive region E located between two adjacent light-emitting regions D, and FIG. 3 shows a case where one lens 114 is disposed between two adjacent light-emitting regions D. Similarly, second lenses 115 mentioned below are disposed with reference to the above.

As shown in FIG. 3, the display substrate 100 further includes an encapsulation layer 109 disposed on a side of the plurality of first lenses 114 away from the substrate 101. The encapsulation layer 109 is capable of blocking and absorbing water vapor and blocking oxygen, so that the display substrate 100 achieves a good encapsulation effect and is not prone to encapsulation failure. For example, the encapsulation layer 109 may be an encapsulation film or an encapsulation substrate.

As shown in FIGS. 2 and 3, the display substrate 100 further includes a plurality of second lenses 115 disposed on a side of the encapsulation layer 109 away from the substrate 101. The plurality of second lenses 115 are located in the light-transmissive region E. In a direction Y perpendicular to the substrate 101, a second lens 115 is arranged opposite to a first lens 114, and a focal point G1 of the first lens 114 coincides or substantially coincides with a focal point G2 of the second lens 115 that is arranged opposite to the first lens 114. For example, the first lens 114 and the second lens 115 that are arranged opposite may be directly opposite to each other. the first lens 114 and the second lens 115 being directly opposite to each other means that a line connecting centers of the first lens 114 and the second lens 115 is perpendicular to the substrate 101.

The second lens 115 is configured to converge light rays from a side of the second lens 115 away from the substrate 101 (i.e., the display side I of the display substrate 100). The first lens 114 is configured to restore propagation directions of the light rays converged by the second lens 115 to propagation directions of the light rays before passing through the second lens 115.

For example, as shown in FIG. 3, a surface of the first lens 114 away from the substrate 101 is a curved surface, and the curved surface of the first lens 114 is convex in a direction away from the substrate 101. For example, the first lens 114 is a convex lens, which is capable of converging light rays.

For example, as shown in FIG. 3, a surface of the second lens 115 away from the substrate 101 is a curved surface, and the curved surface of the second lens 115 is convex in the direction away from the substrate 101. For example, the second lens 115 is a convex lens, which is capable of converging light rays.

For example, as shown in FIG. 3, the surface of the first lens 114 away from the substrate 101 and the surface of the second lens 115 away from the substrate 101 are both curved surfaces, and the curved surfaces of the first lens 114 and the second lens 115 are convex in the direction away from the substrate 101. For example, both the first lens 114 and the second lens 115 are convex lenses, which are capable of converging light rays. In the embodiments of the present disclosure, the first lens 114 and the second lens 115 are not limited to the structures described above.

In the embodiments of the present disclosure, the plurality of first lenses 114 and the plurality of second lenses 115 are disposed in the light-transmissive region E of the display substrate 100, and in the direction Y perpendicular to the substrate 101, a single second lens 115 is arranged opposite to a single first lens 114. The light rays from the display side I is converged by the second lenses 115, so that an incident amount of the light rays in the display substrate 100 may be increased, and in turn, light transmittance of the display substrate 100 is increased. Therefore, an amount of light rays received by the functional devices C located under the display substrate 100 is increased, which may improve the accuracy of the functional devices C for signal sensing.

In addition, the focal point G1 of the first lens 114 coincides or substantially coincides with the focal point G2 of the second lens 115 that is arranged opposite to the first lens 114, and the first lens 114 may restore the propagation directions of the light rays converged by the second lens 115 to the propagation directions of the light rays before passing through the second lens 115, so that the propagation directions of the light rays do not change after passing through the first lens 114 and the second lens 115. As a result, mutual interference between the light rays may be avoided, which may further improve the accuracy of the functional device C for signal sensing.

In some embodiments, in the case where the focal point G1 of the first lens 114 coincides or substantially coincides with the focal point G2 of the second lens 115 that is arranged opposite to the first lens 114, in the direction Y perpendicular to the substrate 101, a distance between the first lens 114 and the second lens 115 is in a range of 6 μm to 20 μm, inclusive. For example, the distance may be 6 μm, 9 μm, 13 μm, 16 μm or 20 μm.

It will be noted that, the distance between the first lens 114 and the second lens 115 refers to a distance between a center of the first lens 114 and a center of the second lens 115.

In some embodiments, in the direction Y perpendicular to the substrate 101, a maximum thickness of the first lens 114 is in a range of 2 μm to 15 μm, inclusive, such as 2 μm, 5 μm, 8.5 μm, 10 μm or 15 μm; and/or in the direction Y perpendicular to the substrate 101, a maximum thickness of the second lens 115 is in a range of 2 μm to 15 μm, inclusive, such as 2 μm, 6 μm, 8.5 μm, 11 μm or 15 μm.

It will be noted that, the maximum thickness refers to a largest dimension of dimensions of a lens in the direction Y perpendicular to the substrate 101. For example, in a case where the second lens 115 is a convex lens, referring to FIG. 4, the maximum thickness of the second lens 115 refers to a vertical distance S between a highest point M on the surface of the second lens 115 away from the substrate 101 and a surface of the second lens 115 proximate to the substrate 101.

In some embodiments, a refractive index of the first lens 114 and a refractive index of the second lens 115 are both in a range of 1.7 to 2.3, inclusive, such as 1.7, 1.8, 2.0, 2.2 or 2.3.

In some embodiments, a material of the first lens 114 and a material of the second lens 115 each may include poly-acrylic resin particles, polysiloxane resin particles, epoxy resin particles, or other organic particles. Zirconium oxide ($ZrO_2$) particles, titanium oxide ($TiO_2$) particles, or other inorganic particles may be dispersed in each of the material of the first lens 114 and the material of the second lens 115.

In the related art, a circular polarizer (C-Pol) is adhered to the display substrate to reduce reflection of the display substrate to external light, thereby avoiding an interference to display of the display apparatus. However, the circular polarizer has a low transmittance (for example, the transmittance is only in a range of 40% to 45%) to light emitted by the light-emitting device F, which causes a decrease in brightness of the display apparatus and an increase in power consumption.

In order to solve the above problems, in some embodiments, as shown in FIGS. 2 and 3, the display substrate 100 further includes a color filter layer 111 disposed on the side of the encapsulation layer 109 away from the substrate 101 (i.e., a color filter layer on the encapsulation layer (COE)). A transmittance of the color filter layer 111 to the light emitted by the light-emitting device F may reach 50% to 75%, such as 50%, 60%, 62.5%, 65% or 75%, so that a quality of the images displayed by the display apparatus is improved.

The color filter layer 111 includes a plurality of photoresist units 111A, and in the functional device arrangement region B, an orthographic projection of a photoresist unit 111A on the substrate 101 at least partially overlaps with a light-emitting region D.

For example, the color filter layer 111 includes at least red photoresist units, green photoresist units and blue photoresist units. All of the red photoresist units, the green photoresist units and the blue photoresist units are in a one-to-one correspondence with the light-emitting regions D (or the sub-pixel regions P) of the display substrate 100.

In some embodiments, as shown in FIGS. 2 and 3, the display substrate 100 further includes a black matrix 112 disposed on the side of the encapsulation layer 109 away from the substrate 101. The black matrix 112 is located between every two adjacent photoresist units 111A, and the black matrix 112 is used to separate two adjacent photoresist units 111A, so as to prevent color crosstalk.

A portion of the black matrix 112 located in the functional device arrangement region B has a plurality of through holes H therein, orthographic projections of the plurality of through holes H on the substrate 101 are located within the light-transmissive region E, and orthographic projections of the first lens 114 and the second lens 115 that are arranged opposite to each other on the substrate 101 both at least partially overlap with an orthographic projection of a through hole H on the substrate 101. Thus, light may enter the display substrate 100 from the through holes H.

For example, as shown in FIG. 3, the orthographic projections of the first lens 114 and the second lens 115 that are arranged opposite to each other on the substrate 101 both coincide or substantially coincide with the orthographic projection of the through hole H on the substrate 101, so that the light rays converged by the second lens 115 may enter the display substrate 100 through the through hole H.

In embodiments of the present disclosure, there are various arrangements for the second lenses 115, which will be described in detail below.

In some embodiments, as shown in FIG. 3, the display substrate 100 further includes an optical adhesive layer 113 covering both the color filter layer 111 and the black matrix 112. The second lenses 115 are disposed on a side of the optical adhesive layer 113 away from the substrate 101, which facilitates a fabrication of the second lenses 115. In addition, with this arrangement, the second lens 115 and the light-emitting layer 107 are spaced by multiple film layers, so that the light-emitting layer 107 is prevented from being damaged in a process of fabricating the second lens 115, and light-emitting performance of the light-emitting layer 107 is avoided from being affected.

Figure 4:
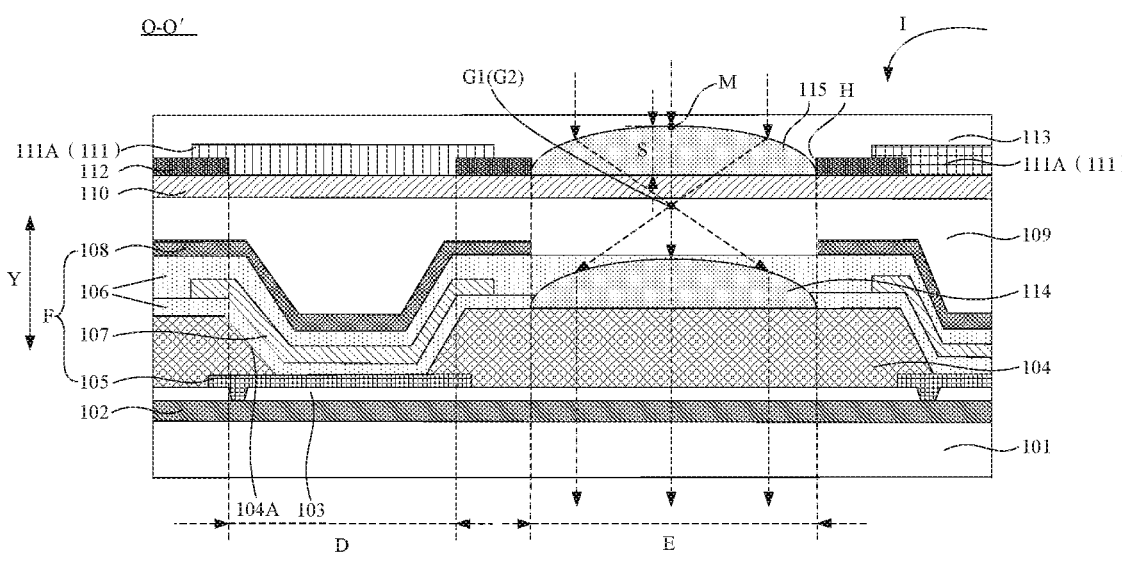

In some other embodiments, as shown in FIG. 4, a single second lens 115 is disposed in a single through hole H in the black matrix 112, so that a space in the through hole H is utilized. Thus, stability of the second lens 115 is improved, the second lens 115 is not prone to fall off, and the second lens 115 may be protected. In addition, the second lens 115 is arranged in the through hole H in the black matrix 112, which is beneficial for thinness and lightness of the display substrate 100.

For example, as shown in FIG. 4, the surface of the second lens 115 proximate to the substrate 101 is flush or substantially flush with a surface of the black matrix 112 proximate to the substrate 101.

With respect to the substrate 101, the highest point M on the surface of the second lens 115 away from the substrate 101 is higher than a surface of the black matrix 112 away from the substrate 101.

Alternatively, the highest point M on the surface of the second lens 115 away from the substrate 101 is flush or substantially flush with the surface of the black matrix 112 away from the substrate 101. In this way, it helps improve flatness of a film layer (i.e., the optical adhesive layer 113) covering both the color filter layer 111 and the second lenses 115.

In some other embodiments, as shown in FIG. 7, in a case where no color filter layer 111 is disposed in the display substrate 100, the display substrate 100 further includes a polarizer 116 disposed on the side of the encapsulation layer 109 away from the substrate 101. The polarizer 116 may be used to reduce reflection of structures capable of reflecting light (e.g., the anode layer 105, the pixel driving circuit layer 102, or metal signal lines) in the display substrate 100 to the external light, so as to prevent the reflection of the external light from interfering with the display of the display apparatus.

The second lenses 115 are disposed between the encapsulation layer 109 and the polarizer 116, and the second lenses 115 are in direct contact with the encapsulation layer 109.

In some embodiments, as shown in FIGS. 3 to 7, the display substrate 100 further includes a pixel defining layer 104 disposed between the substrate 101 and the encapsulation layer 109. The pixel defining layer 104 has a plurality of openings 104A therein, and in the functional device arrangement region B, an orthographic projection of an opening 104A on the substrate 101 at least partially overlaps with a light-emitting region D.

It will be noted that, a sectional shape of the opening 104A in the pixel defining layer 104 is not limited to an inverted trapezoid shown in FIGS. 3 to 7, and the sectional shape of the opening 104A may also be U-shaped, regular trapezoid-shaped, etc.

For example, as shown in FIGS. 3 to 7, the orthographic projection of the opening 104A on the substrate 101 coincides or substantially coincides with the light-emitting region D. The light-emitting layer 107 of the light-emitting device F located in the light-emitting region D is at least partially located in the opening 104A.

Based on the structures described above, in embodiments of the present disclosure, there may be various arrangements for the first lenses 114, which will be described in detail below.

In some embodiments, as shown in FIGS. 3 and 4, the plurality of first lenses 114 are disposed on a side of the pixel defining layer 104 away from the substrate 101, and the plurality of first lenses 114 are in direct contact with the pixel defining layer 104. That is, the plurality of first lenses 114 are fabricated on a surface of the pixel defining layer 104 away from the substrate 101.

Figure 5:
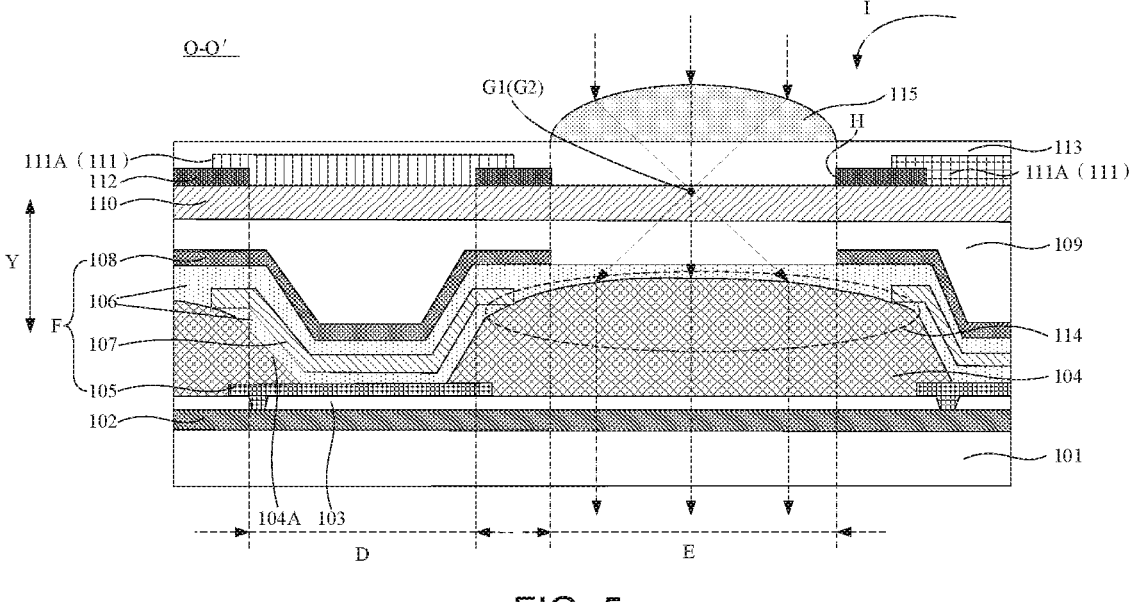
Figure 6:
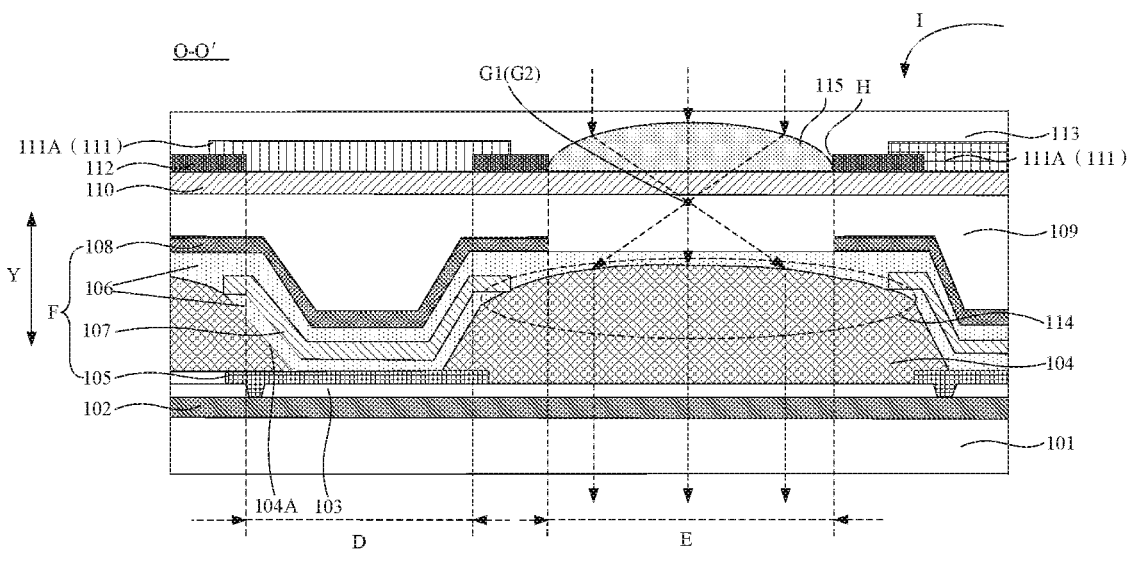

In some other embodiments, as shown in FIGS. 5 and 6, the first lenses 114 are disposed on a surface of the pixel defining layer 104 away from the substrate 101, the first lenses 114 and the pixel defining layer 104 constitute a one-piece structure. That is, the first lenses 114 and the pixel defining layer 104 are made of a same material, which facilitates the fabrication of the first lenses 114.

In some other embodiments, as shown in FIG. 7, the pixel driving circuit layer 102 is disposed between the substrate 101 and the pixel defining layer 104, and the plurality of first lenses 114 are disposed between the substrate 101 and the pixel driving circuit layer 102.

Based on this, according to the arrangements for the first lenses 114 and the arrangements for the second lenses 115, it can be known that there are various arrangement combinations for the first lenses 114 and the second lenses 115, and reference will be made in the following embodiments.

In some embodiments, as shown in FIG. 3, the plurality of first lenses 114 are disposed on the side of the pixel defining layer 104 away from the substrate 101, and the plurality of first lenses 114 are in direct contact with the pixel defining layer 104. In addition, the second lenses 115 are disposed on the side of the optical adhesive layer 113 away from the substrate 101.

In some other embodiments, as shown in FIG. 4, the plurality of first lenses 114 are disposed on the side of the pixel defining layer 104 away from the substrate 101, and the plurality of first lenses 114 are in direct contact with the pixel defining layer 104. In addition, the second lenses 115 are disposed in the through holes H in the black matrix 112, and a second lens 115 is disposed in a through hole H in the black matrix 112.

In some other embodiments, as shown in FIG. 5, the first lenses 114 are disposed on the surface of the pixel defining layer 104 away from the substrate 101, the first lenses 114 and the pixel defining layer 104 constitute the one-piece structure. That is, the first lenses 114 and the pixel defining layer 104 are made of the same material. In addition, the second lenses 115 are disposed on the side of the optical adhesive layer 113 away from the substrate 101.

In some other embodiments, as shown in FIG. 6, the first lenses 114 are disposed on the surface of the pixel defining layer 104 away from the substrate 101, the first lenses 114 and the pixel defining layer 104 constitute the one-piece structure. That is, the first lenses 114 and the pixel defining layer 104 are made of the same material. In addition, the second lenses 115 are disposed in the through holes H in the black matrix 112, and a second lens 115 is disposed in a through hole H in the black matrix 112.

In some other embodiments, as shown in FIG. 7, the plurality of first lenses 114 are disposed between the substrate 101 and the pixel driving circuit layer 102. In addition, the second lenses 115 are disposed between the encapsulation layer 109 and the polarizer 116, and the second lenses 115 are in direct contact with the encapsulation layer 109.

Embodiments of the present disclosure are not limited to the arrangement combinations for the first lenses 114 and the second lenses 115 described above.

In order to further increase the light transmittance of the display substrate 100, the following embodiments may be adopted.

In some embodiments, as shown in FIGS. 3 to 7, orthographic projections of portions of the cathode layer 108 located in the functional device arrangement region B on the substrate 101 do not overlap with the light-transmissive region E. That is, the patterned cathode layer 108 is adopted, and the orthographic projections of the portions of the cathode layer 108 on the substrate 101 are ensured to cover respective light-emitting regions D.

With this arrangement, light rays propagate through the light-transmissive region E, but the light rays do not pass through the cathode layer 108, which avoids the cathode layer 108 from blocking the light rays, and further improves the light transmittance of the display substrate 100.

In some other embodiments, the cathode layer 108 covers the display region AA of the display substrate 100, so that a resistance value of the cathode layer 108 is small. As a result, a voltage drop (i.e., IR drop) of a cathode voltage signal is reduced when the cathode voltage signal is transmitted in the entire cathode layer 108.

In the case where the cathode layer 108 covers the display region AA of the display substrate 100, a material of the cathode layer 108 may include a material with high transparency, such as indium zinc oxide (IZO), which may ameliorate the problem of blocking light by the cathode layer 108.

In some embodiments, as shown in FIG. 3, the display substrate 100 further includes a plurality of film layers disposed between the first lenses 114 and the second lenses 115. A refractive index of each film layer in the plurality of film layers is less than a refractive index of the first lens 114 and less than a refractive index of the second lens 115. By adjusting a thickness and a refractive index of each film layer, the focal point G1 of the first lens 114 may coincide or substantially coincide with the focal point G2 of the second lens 115.

For example, as shown in FIGS. 3 and 5, in the direction Y perpendicular to the substrate 101 and directed from the first lens 114 to the second lens 115, the plurality of film layers include common layer(s) 106, the encapsulation layer 109, a touch function layer 110 and the optical adhesive layer 113 that are stacked in sequence.

For example, as shown in FIGS. 4 and 6, in the direction Y perpendicular to the substrate 101 and directed from the first lens 114 to the second lens 115, the plurality of film layers include common layer(s) 106, the encapsulation layer 109 and the touch function layer 110 that are stacked in sequence.

For example, as shown in FIG. 7, in the direction Y perpendicular to the substrate 101 and directed from the first lens 114 to the second lens 115, the plurality of film layers include the pixel driving circuit layer 102, the planarization layer 103, the pixel defining layer 104, common layer(s) 106 and the encapsulation layer 109 that are stacked in sequence.

In addition, in some embodiments, on a premise that the display effect of the display apparatus 200 is not affected, by reducing pixels per inch (which is abbreviated as PPI, and represents the number of pixels (a region occupied by the pixel includes at least one light-emitting region D) per inch of the display region AA of the display substrate 100) of the functional device arrangement region B, a total area of the light-emitting regions D in the functional device arrangement region B may be reduced, so as to increase the area of the light-transmissive region E. As a result, the light transmittance of the functional device arrangement region B of the display substrate 100 is further improved.

Some embodiments of the present disclosure provide a manufacturing method for a display substrate. As shown in FIG. 8A, the manufacturing method includes S1 to is S3.

In S1, as shown in FIGS. 9D, 10B, 12B and 13A, a plurality of first lenses 114 are formed on a substrate 101. The plurality of first lenses 114 are located in the light-transmissive region E.

Figure 9A:
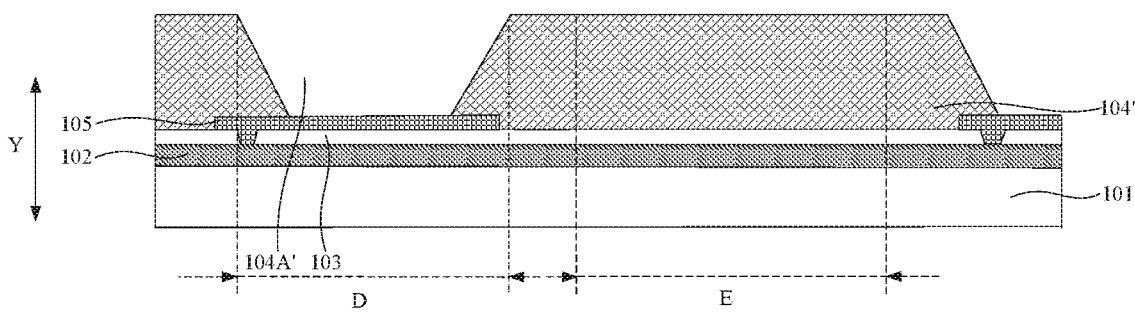
FIGS. 9A to 9I are diagrams showing steps in a manufacturing method for a display substrate, in accordance with some embodiments.

For example, S1 includes S101 to S104. In S101, as shown in FIG. 9A, a pixel defining layer structure 104' is formed on the substrate 101. The pixel defining layer structure 104' has a plurality of opening structures 104A' therein, and in the functional device arrangement region B, an orthographic projection of an opening structure 104A' on the substrate 101 at least partially overlaps with a light-emitting region D.

Figure 9B:
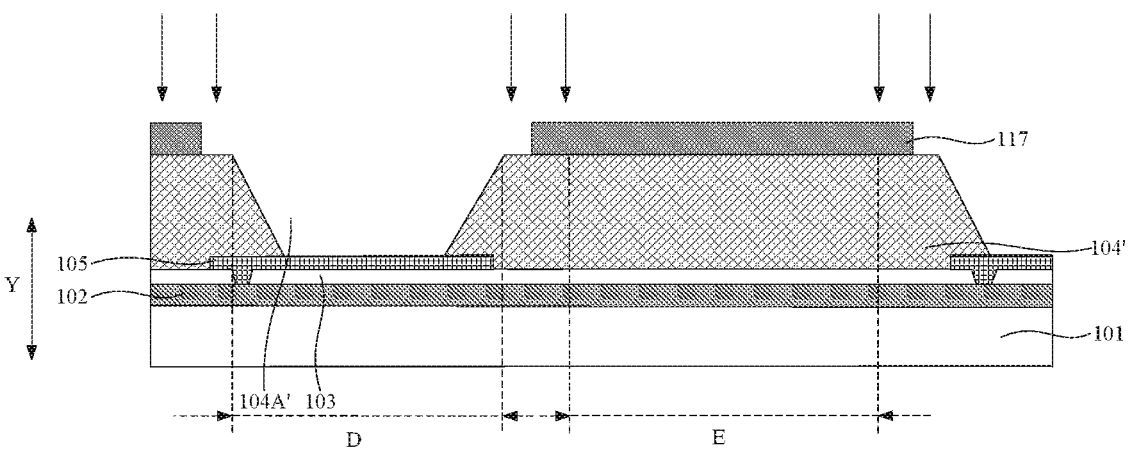

In S102, as shown in FIG. 9B, a blocking layer 117 is formed on a side of the pixel defining layer structure 104' away from the substrate 101 by using a photolithography process. An orthographic projection of the blocking layer 117 on the substrate 101 at least partially overlaps with the light-transmissive region E.

Figures 9C, 9D:
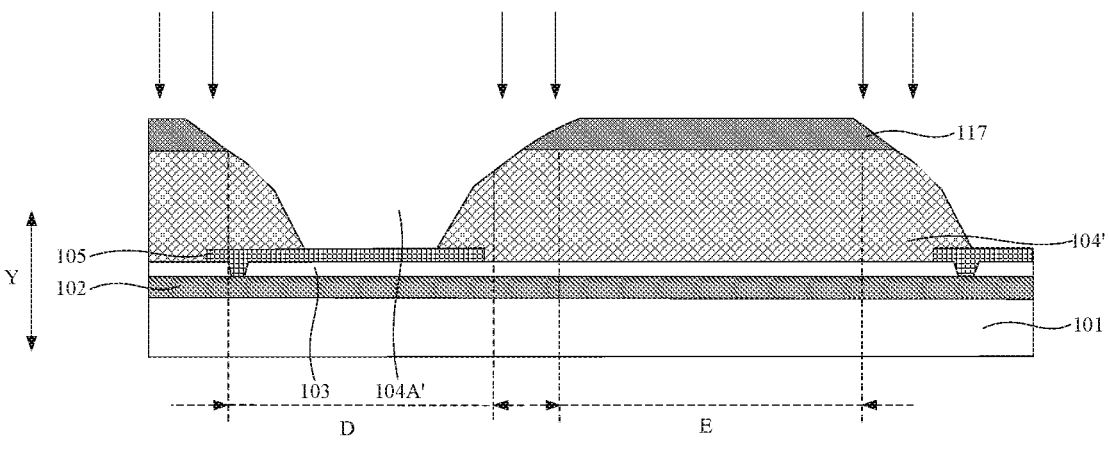

In S103, as shown in FIG. 9C, an edge portion of the blocking layer 117 and a portion of the pixel defining layer structure 104' not covered by the blocking layer 117 are etched by using a dry etching process, and a critical dimension bias (CD bias) of the dry etching process is adjusted.

In S104, as shown in FIG. 9D, an unetched portion of the blocking layer 117 is removed by using stripping solution to obtain a pixel defining layer 104 and the plurality of first lenses 114. The pixel defining layer 104 has a plurality of opening 104A formed through the plurality of opening structures 104A'; the plurality of first lenses 114 are located on a surface of the pixel defining layer 104 away from the substrate 101, the plurality of first lenses 114 and the pixel defining layer 104 form a one-piece structure. A middle portion of the first lens 114 has a small thickness and an edge portion of the first lens 114 has a large thickness.

In the manufacturing method in the embodiments of the present disclosure described above, the plurality of first lenses 114 may be formed in a process of fabricating the pixel defining layer 104. Thus, a fabricating process of the first lenses 114 is simplified, which reduces process steps of the display substrate 100.

In some embodiments, as shown in FIG. 8B, after S1, the manufacturing method for the display substrate further includes S11.

Figure 9E:
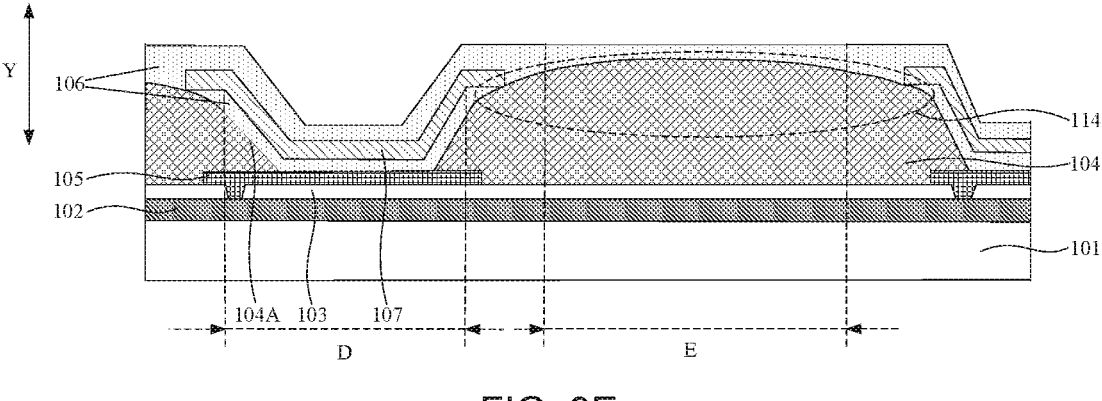

In S11, as shown in FIG. 9E, common layers 106 and a light-emitting layer 107 are formed on a side of the pixel defining layer 104 away from the substrate 101. Orthographic projections of the common layers 106 and the light-emitting layer 107 on the substrate 101 cover the orthographic projection of the opening 104A in the pixel defining layer 104 on the substrate 101.

In the manufacturing method of the embodiments of the present disclosure, the pixel defining layer 104 and the first lenses 114 are firstly fabricated, and then the common layers 106 and the light-emitting layer 107 are fabricated, which avoids introducing oxygen atoms in a process of fabricating the pixel defining layer 104 and the first lenses 114, and thereby avoids affecting light-emitting performance of the light-emitting layer 107.

Figure 9F:
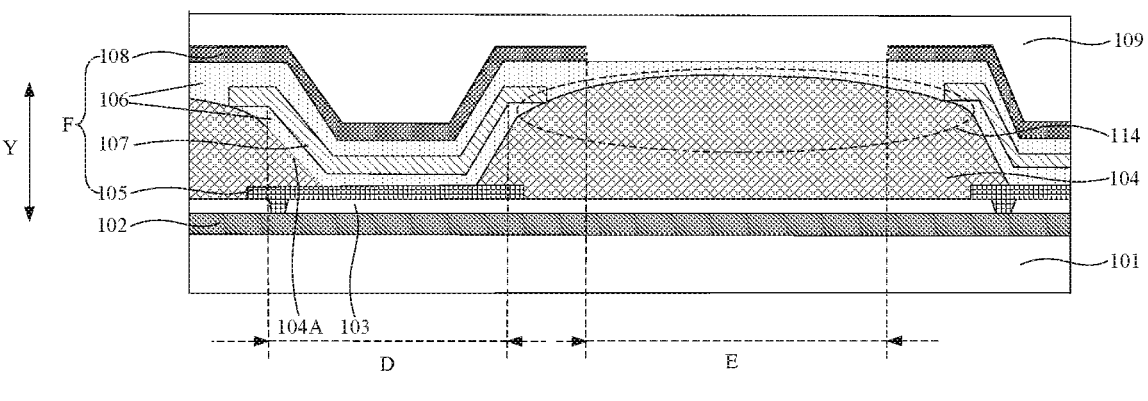

In S2, as shown in FIG. 9F, an encapsulation layer 109 is formed on a side of the plurality of first lenses 114 away from the substrate 101.

In some embodiments, as shown in FIG. 8B, after S2, the manufacturing method for the display substrate 100 further includes S21 and S22.

Figure 9G:
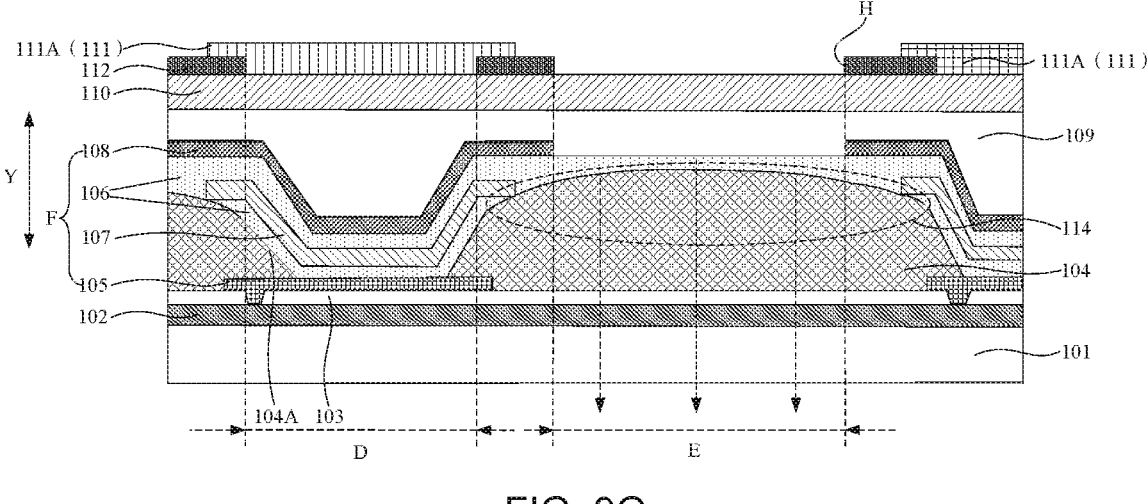

In S21, as shown in FIG. 9G, a color filter layer 111 and a black matrix 112 are formed on a side of the encapsulation layer 109 away from the substrate 101. The color filter layer 111 includes a plurality of photoresist units 111A, and in the functional device arrangement region B, an orthographic projection of a photoresist unit 111A on the substrate 101 at least partially overlaps with a light-emitting region D. The black matrix 112 is located between every two adjacent photoresist units 111A, a portion of the black matrix 112 located in the functional device arrangement region B has a plurality of through holes H therein, and orthographic projections of the plurality of through holes H on the substrate 101 are located within the light-transmissive region E.

Figure 9H:
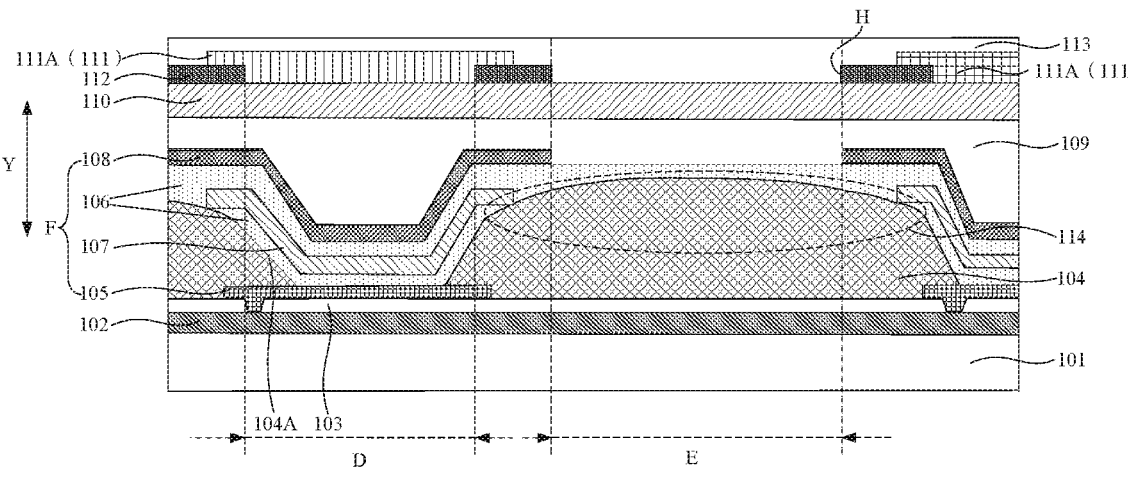

In S22, as shown in FIG. 9H, an optical adhesive layer 113 covering the color filter layer 111 and the black matrix 112 is formed.

In S3, as shown in FIGS. 9I, 11, 12C and 13B, a plurality of second lenses 115 are formed on a side of the encapsulation layer 109 away from the substrate 101. The plurality of second lenses 115 are located in the light-transmissive region E. In the direction Y perpendicular to the substrate 101, a second lens 115 is arranged opposite to a first lens 114, and a focal point G1 of the first lens 114 coincides or substantially coincides with a focal point G2 of the second lens 115 that is arranged opposite to the first lens 114.

Figure 9I:
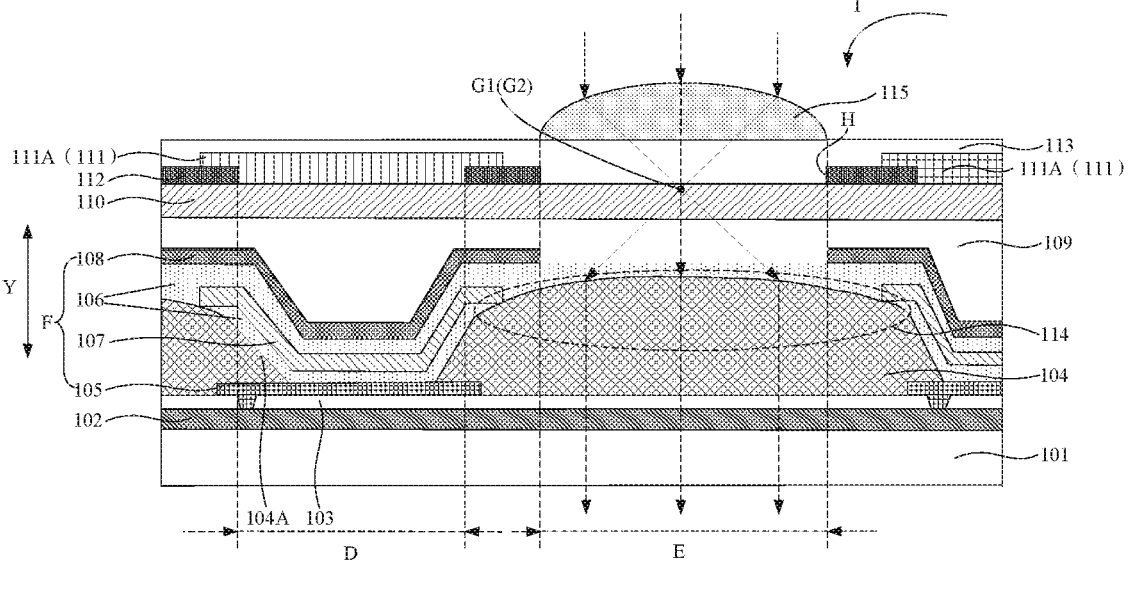

For example, as shown in FIG. 9I, the plurality of second lenses 115 may be formed on a side of the optical adhesive layer 113 away from the substrate 101 by a method similar to that for fabricating the first lenses 114, which will not be repeated here.

Embodiments of the present disclosure provide a manufacturing method for another display substrate 100, which is different from S1 in the above manufacturing method for the display substrate 100. S1 includes S105 and S106.

Figure 10A:
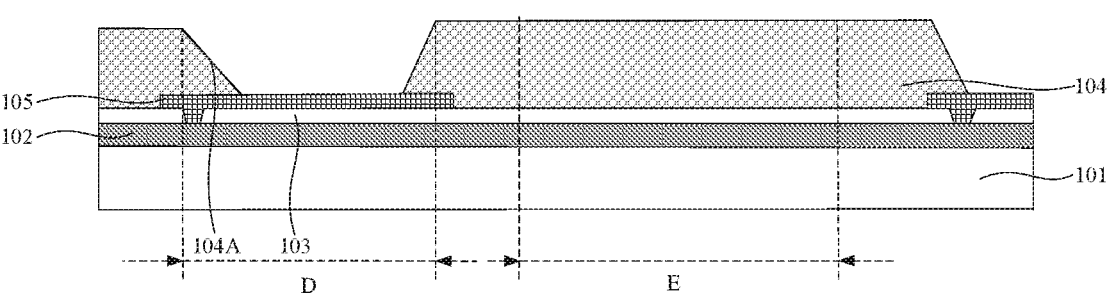
FIGS. 10A and 10B are diagrams showing steps in a manufacturing method for another display substrate, in accordance with some embodiments.

In S105, as shown in FIG. 10A, a pixel defining layer 104 is formed on the substrate 101. The pixel defining layer 104 has a plurality of openings 104A therein, and in the functional device arrangement region B, an orthographic projection of an opening 104A on the substrate 101 at least partially overlaps with a light-emitting region D.

Figure 10B:
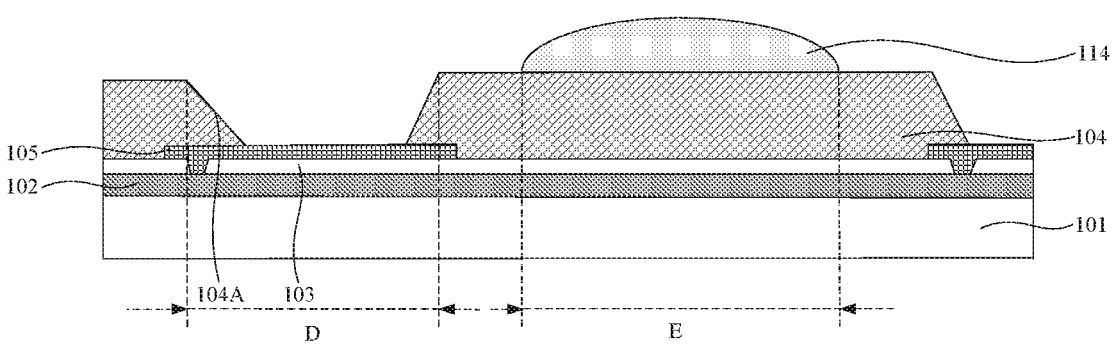

In S106, as shown in FIG. 10B, the plurality of first lenses 114 are formed on a side of the pixel defining layer 104 away from the substrate 101, and the plurality of first lenses 114 are in direct contact with the pixel defining layer 104.

Embodiments of the present disclosure further provide a manufacturing method for yet another display substrate 100 (in which steps that are the same as those in the method for manufacturing the display substrate 100 described above will not be repeated here), which is different from S3 in the above manufacturing method for the display substrate 100. S3 includes S301.

Figure 11:
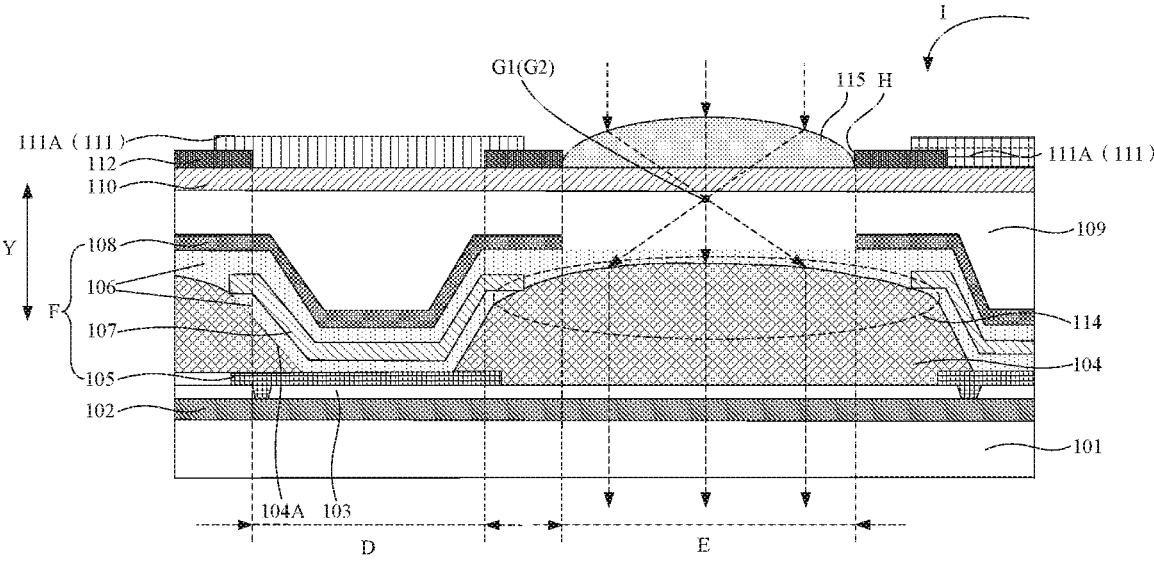
FIG. 11 is a diagram showing a step in a manufacturing method for yet another display substrate, in accordance with some embodiments.

In S301, after S21 and before S22, as shown in FIG. 11, the second lenses 115 are formed in the through holes H in the black matrix 112, respectively.

Embodiments of the present disclosure further provide a manufacturing method for yet another display substrate 100, which is different from S1 and S3 in the above manufacturing method for the display substrate 100. S1 includes S107 and S108, and S3 includes S302.

Figure 12A:
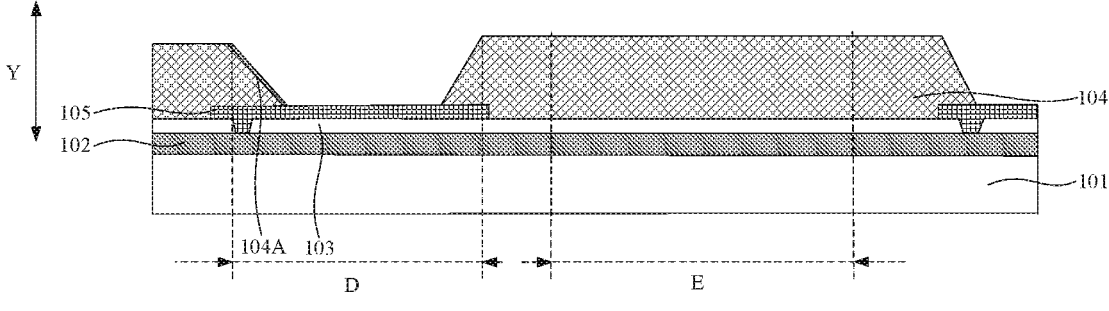
FIGS. 12A to 12C are diagrams showing steps in a manufacturing method for yet another display substrate, in accordance with some embodiments.

In S107, as shown in FIG. 12A, a pixel defining layer 104 is formed on the substrate 101. The pixel defining layer 104 has a plurality of openings 104A therein, and in the functional device arrangement region B, an orthographic projection of an opening 104A on the substrate 101 at least partially overlaps with a light-emitting region D.

Figure 12B:
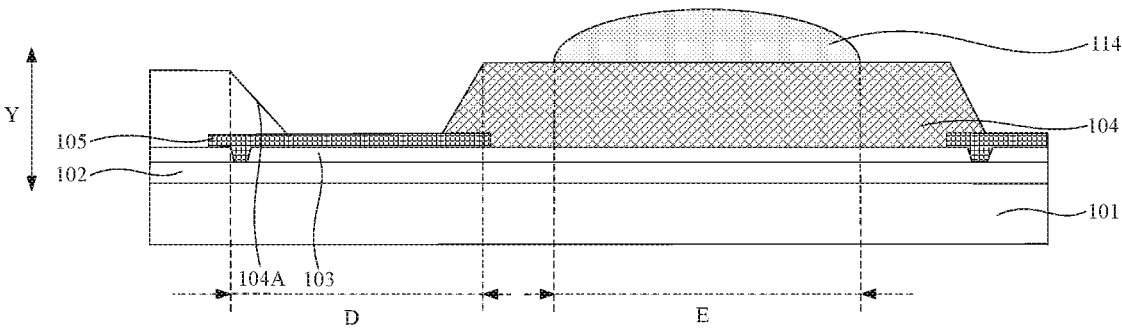

In S108, as shown in FIG. 12B, the plurality of first lenses 114 are formed on a side of the pixel defining layer 104 away from the substrate 101, and the plurality of first lenses 114 are in direct contact with the pixel defining layer 104.

Figure 12C:
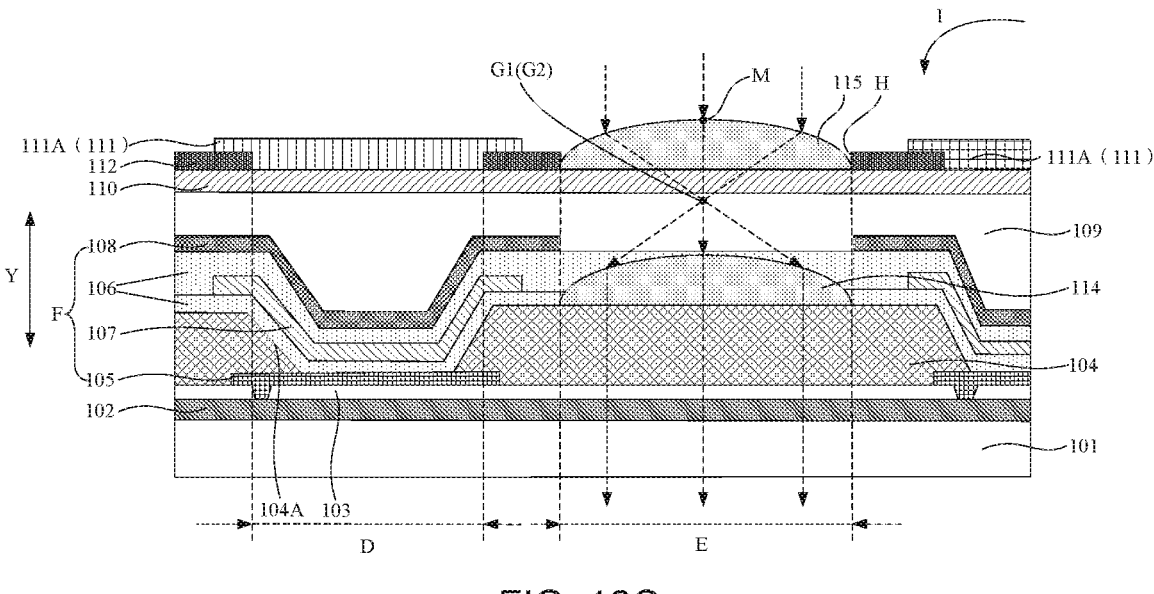

In S302, as shown in FIG. 12C, after S21 and before S22, the second lenses 115 are formed in the through holes H in the black matrix 112, respectively.

Embodiments of the present disclosure further provide a manufacturing method for yet another display substrate 100, which is different from S1 and S3 in the above manufacturing method for the display substrate 100. S1 includes S109, and S3 includes S303.

Figure 13A:
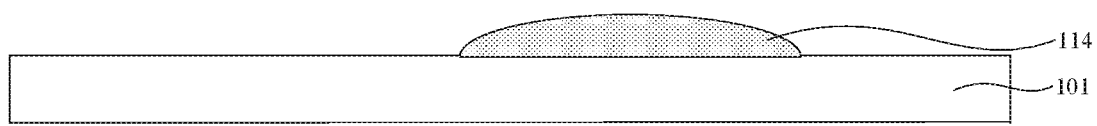
FIGS. 13A and 13B are diagrams showing steps in a manufacturing method for yet another display substrate, in accordance with some embodiments.

In S109, as shown in FIG. 13A, the plurality of first lenses 114 are formed on the substrate 101. The plurality of first lenses 114 are in direct contact with the substrate 101.

Figure 13B:
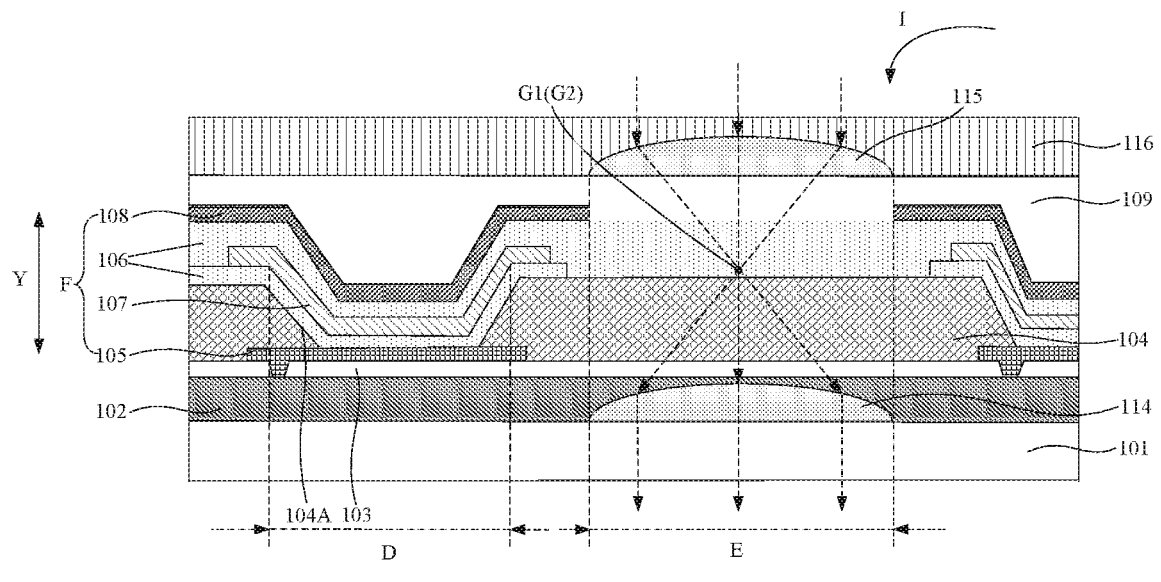

In S303, as shown in FIG. 13B, the plurality of second lenses 115 are formed on the side of the encapsulation layer 109 away from the substrate 101, and the plurality of second lenses 115 are in direct contact with the encapsulation layer 109.

A polarizer 116 is provided on a side of the plurality of second lenses 115 away from the substrate 101.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate having a display region, wherein the display region includes a functional device arrangement region, the functional device arrangement region includes a plurality of light-emitting regions and a light-transmissive region located at peripheries of the plurality of light-emitting regions; the display substrate comprises:

a substrate;

a plurality of first lenses disposed on the substrate, the plurality of first lenses being located in the light-transmissive region;

an encapsulation layer disposed on a side of the plurality of first lenses away from the substrate;

a plurality of second lenses disposed on a side of the encapsulation layer away from the substrate, wherein the plurality of second lenses are located in the light-transmissive region; in a direction perpendicular to the substrate, a second lens in the plurality of second lenses is arranged opposite to a first lens in the plurality of first lenses, and a focal point of the first lens substantially coincides with a focal point of the second lens that is arranged opposite to the first lens;

a color filter layer disposed on the side of the encapsulation layer away from the substrate, wherein the color filter layer includes a plurality of photoresist units, and in the functional device arrangement region, an orthographic projection of a photoresist unit in the plurality of photoresist units on the substrate at least partially overlaps with a light-emitting region in the plurality of light-emitting regions;

a black matrix disposed on the side of the encapsulation layer away from the substrate, wherein the black matrix is located between every two adjacent photoresist units; a portion of the black matrix located in the functional device arrangement region has a plurality of through holes therein, orthographic projections of the plurality of through holes on the substrate are located within the light-transmissive region, and orthographic projections of the first lens and the second lens that are arranged opposite to each other on the substrate both at least partially overlap with an orthographic projection of a through hole in the plurality of through holes on the substrate; and an optical adhesive layer covering both the color filter layer and the black matrix; wherein the plurality of second lenses are disposed on a side of the optical adhesive layer away from the substrate; or the second lens is disposed in the through hole in the black matrix.

2. The display substrate according to claim 1, wherein in a case where the second lens is disposed in the through hole in the black matrix, a surface of the second lens proximate to the substrate is substantially flush with a surface of the black matrix proximate to the substrate; and with respect to the substrate, a highest point on a surface of the second lens away from the substrate is higher than a surface of the black matrix away from the substrate, or the highest point on the surface of the second lens away from the substrate is substantially flush with the surface of the black matrix away from the substrate.

3. The display substrate according to claim 1, further comprising:

a pixel defining layer disposed between the substrate and the encapsulation layer, wherein the pixel defining layer has a plurality of openings therein, and in the functional device arrangement region, an orthographic projection of an opening in the plurality of openings on the substrate at least partially overlaps with a light-emitting region in the plurality of light-emitting regions.

4. The display substrate according to claim 3, wherein the plurality of first lenses are disposed on a surface of the pixel defining layer away from the substrate, the plurality of first lenses and the pixel defining layer constitute a one-piece structure.

5. The display substrate according to claim 3, wherein the plurality of first lenses are disposed on a side of the pixel defining layer away from the substrate, and the plurality of first lenses are in direct contact with the pixel defining layer.

6. The display substrate according to claim 3, further comprising:

a pixel driving circuit layer disposed between the substrate and the pixel defining layer, wherein the plurality of first lenses are disposed between the substrate and the pixel driving circuit layer.

7. The display substrate according to claim 1, wherein a surface of the first lens away from the substrate is a curved surface, and the curved surface of the first lens is convex in a direction away from the substrate; and/or a surface of the second lens away from the substrate is a curved surface, and the curved surface of the second lens is convex in the direction away from the substrate.

8. The display substrate according to claim 1, wherein the first lens is a convex lens; and/or the second lens is another convex lens.

9. The display substrate according to claim 7, wherein in the direction perpendicular to the substrate, a maximum thickness of the first lens is in a range of 2 μm to 15 μm, inclusive; and/or in the direction perpendicular to the substrate, a maximum thickness of the second lens is in a range of 2 μm to 15 μm, inclusive.

10. The display substrate according to claim 1, further comprising:

a cathode layer disposed between the substrate and the encapsulation layer, wherein the cathode layer covers the display region of the display substrate; or orthographic projections of portions of the cathode layer located in the functional device arrangement region on the substrate do not overlap with the light-transmissive region.

11. The display substrate according to claim 1, further comprising:

a plurality of film layers disposed between the plurality of first lenses and the plurality of second lenses, wherein a refractive index of each film in the plurality of film layers is less than a refractive index of the first lens, and less than a refractive index of the second lens.

12. The display substrate according to claim 1, wherein in the direction perpendicular to the substrate, a distance between the first lens and the second lens that are arranged opposite to each other is in a range of 6 μm to 20 μm, inclusive.

13. A display apparatus, comprising the display substrate according to claim 1, and at least one camera located on a non-display side of the display substrate.

14. A manufacturing method for a display substrate, wherein the display substrate has a display region, the display region includes a functional device arrangement region; the functional device arrangement region includes a plurality of light-emitting regions that are non-light-transmissive, and a light-transmissive region located at peripheries of the plurality of light-emitting regions; the manufacturing method comprises:

forming a plurality of first lenses on a substrate, the plurality of first lenses being located in the light-transmissive region;

forming an encapsulation layer on a side of the plurality of the first lenses away from the substrate; and forming a plurality of second lenses on a side of the encapsulation layer away from the substrate, wherein the plurality of second lenses are located in the light-transmissive region; in a direction perpendicular to the substrate, a second lens in the plurality of second lenses is arranged opposite to a first lens in the plurality of first lenses, and a focal point of the first lens substantially coincides with a focal point of the second lens that is arranged opposite to the first lens; and the manufacturing method further comprises:

forming a color filter layer and a black matrix on the side of the encapsulation layer away from the substrate, wherein the color filter layer includes a plurality of photoresist units, and in the functional device arrangement region, an orthographic projection of a photoresist unit in the plurality of photoresist units on the substrate at least partially overlaps with a light-emitting region in the plurality of light-emitting regions; the black matrix is located between every two adjacent photoresist units; a portion of the black matrix located in the functional device arrangement region has a plurality of through holes therein, and orthographic projections of the plurality of through holes on the substrate are located within the light-transmissive region; and forming an optical adhesive layer covering both the color filter layer and the black matrix; wherein forming the plurality of second lenses on the side of the encapsulation layer away from the substrate, includes:

forming the plurality of second lenses in the through holes in the black matrix, respectively; or forming the plurality of second lenses on the side of the encapsulation layer away from the substrate, includes:

forming the plurality of second lenses on a side of the optical adhesive layer away from the substrate.

15. The manufacturing method according to claim 14, wherein forming the plurality of first lenses on the substrate, includes:

forming a pixel defining layer and the plurality of first lenses simultaneously, wherein the plurality of first lenses are located on a surface of the pixel defining layer away from the substrate, the plurality of first lenses and the pixel defining layer form a one-piece structure; the pixel defining layer has a plurality of openings therein, and in the functional device arrangement region, an orthographic projection of an opening in the plurality of openings on the substrate at least partially overlaps with a light-emitting region in the plurality of light-emitting regions; or forming the plurality of first lenses on the substrate, includes:

forming a pixel defining layer on the substrate, wherein the pixel defining layer has a plurality of openings therein, and in the functional device arrangement region, an orthographic projection of an opening in the plurality of openings on the substrate at least partially overlaps with a light-emitting region in the plurality of light-emitting regions; and forming the plurality of first lenses on a side of the pixel defining layer away from the substrate, the plurality of first lenses being in direct contact with the pixel defining layer; or forming the plurality of first lenses on the substrate, includes:

forming the plurality of first lenses on the substrate, the plurality of first lenses being in direct contact with the substrate.

16. A display substrate having a display region, wherein the display region includes a functional device arrangement region, the functional device arrangement region includes a plurality of light-emitting regions and a light-transmissive region located at peripheries of the plurality of light-emitting regions; the display substrate comprises:

a substrate;

a plurality of first lenses disposed on the substrate, the plurality of first lenses being located in the light-transmissive region;

an encapsulation layer disposed on a side of the plurality of first lenses away from the substrate;

a plurality of second lenses disposed on a side of the encapsulation layer away from the substrate, wherein the plurality of second lenses are located in the light-transmissive region; in a direction perpendicular to the substrate, a second lens in the plurality of second lenses is arranged opposite to a first lens in the plurality of first lenses, and a focal point of the first lens substantially coincides with a focal point of the second lens that is arranged opposite to the first lens;

a pixel defining layer disposed between the substrate and the encapsulation layer, wherein the pixel defining layer has a plurality of openings therein, and in the functional device arrangement region, an orthographic projection of an opening in the plurality of openings on the substrate at least partially overlaps with a light-emitting region in the plurality of light-emitting regions; and a pixel driving circuit layer disposed between the substrate and the pixel defining layer; wherein the plurality of first lenses are disposed on a surface of the pixel defining layer away from the substrate, the plurality of first lenses and the pixel defining layer constitute a one-piece structure; or the plurality of first lenses are disposed between the substrate and the pixel driving circuit layer.

* * * * *